(12) United States Patent
Banba et al.

(10) Patent No.: US 6,927,633 B2
(45) Date of Patent: Aug. 9, 2005

(54) HIGH FREQUENCY CIRCUIT WITH THIN FILM RESISTOR

(75) Inventors: Seiichi Banba, Oogaki (JP); Yasuhiro Kaizaki, Gifu-ken (JP)

(73) Assignee: Sanyo Electric Co., Ltd., Moriguchi (JP)

(*) Notice: Subject to any disclaimer, the term of this patent is extended or adjusted under 35 U.S.C. 154(b) by 20 days.

(21) Appl. No.: 09/813,303

(22) Filed: Mar. 21, 2001

(65) Prior Publication Data

US 2002/0008553 A1 Jan. 24, 2002

(30) Foreign Application Priority Data

Mar. 24, 2000 (JP) .................................. 2000-083844
Mar. 5, 2001 (JP) .................................. 2001-059428

(51) Int. Cl.[7] ............................................... H03G 3/12
(52) U.S. Cl. .................... 330/283; 330/307; 330/261; 330/269; 338/61; 338/293; 338/292; 327/170; 327/380; 327/389
(58) Field of Search .................... 330/283, 307, 330/261, 269; 327/170, 380, 389; 338/61, 293, 292

(56) References Cited

U.S. PATENT DOCUMENTS

| | | | |
|---|---|---|---|
| 2,787,560 A | * | 4/1957 | Shaw |
| 3,449,683 A | | 6/1969 | Gane ........................... 330/21 |
| 3,940,706 A | * | 2/1976 | Stegens ....................... 330/286 |
| 4,134,080 A | * | 1/1979 | Gentzler ...................... 330/307 |
| 4,717,888 A | * | 1/1988 | Vinn et al. .................. 330/261 |
| 5,200,713 A | | 4/1993 | Grace et al. ................ 331/49 |
| 5,546,033 A | * | 8/1996 | Campbell et al. ........... 327/170 |

FOREIGN PATENT DOCUMENTS

| | | | |
|---|---|---|---|
| EP | 0 794 613 A1 | | 9/1997 |
| JP | 62142403 | * | 6/1987 |
| JP | 5-347501 | | 12/1993 |
| JP | 06294875 | | 10/1994 |
| JP | 06333856 | | 12/1994 |
| JP | 7-307337 | | 11/1995 |

OTHER PUBLICATIONS

Millmau "Microelectronics" McGraw Hill 1979 p. 564.*
Holt "Electronic Circuits" John Wiley & Sons, Inc Copyright 1978 p. 384.*
Ridha et al. "0.18 & mu ; m SiGe BiCMos technology for wireless and 40Gb/s communication products" Bipolar/BiCMos Circuits and Technology Meeting, Proceeding of the 2001 pp 147–150.*
Office action and translation dated Oct. 21, 2003 from the corresponding European application.
IEEE Transactions on Microwave Theory and Techniques, vol. 37, No. 10, pp. 241–247, Oct. 1989.

* cited by examiner

Primary Examiner—Michael B. Shingleton
(74) Attorney, Agent, or Firm—Westerman, Hattori, Daniels & Adrian, LLP

(57) ABSTRACT

A first circuit which is constituted by a thin film resistor is connected between the collector of a transistor and a power supply terminal, and a second circuit which is constituted by a semiconductor resistor is connected between the emitter of the transistor and a grounding terminal. The film thickness of a thin film resistor is set to not more than its skin depth at a frequency to be compensated for.

18 Claims, 14 Drawing Sheets

F I G. 1
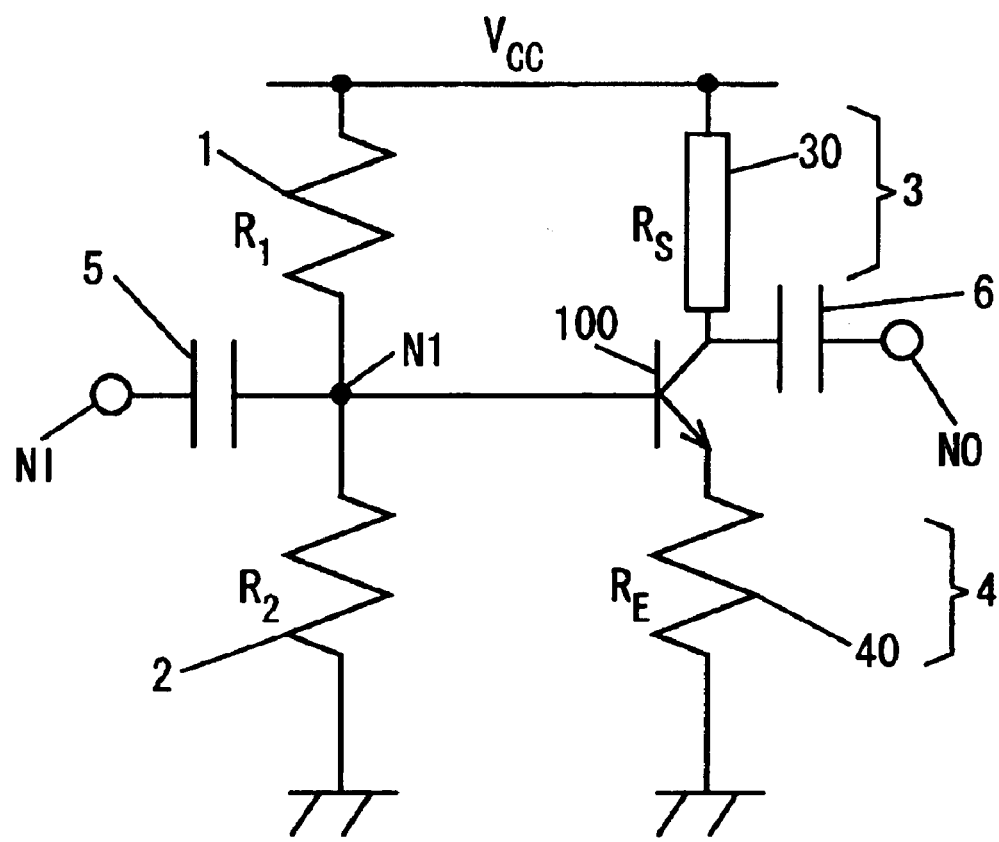

HIGH FREQUENCY CIRCUIT WITH THIN FILM RESISTOR

BACKGROUND OF THE INVENTION

1. Field of the Invention

The present invention relates to a high frequency circuit including a transistor.

2. Description of the Background Art

Conventionally, various high frequency circuits such as amplifiers using active devices such as bipolar transistors or field effect transmitters have been used. FIG. 18 is a circuit diagram of a conventional emitter grounded wide-band amplifier using a bipolar transistor.

The amplifier shown in FIG. 18 comprises a bipolar transistor (hereinafter abbreviated as a transistor) 200, resistors 11, 12, 13, 14, and 15, and capacitors 16, 17, and 18. The transistor 200 has its base connected to a node N11. The node N11 is connected to an input terminal NI through the capacitor 16. The resistor 11 is connected between a power supply terminal receiving a power supply voltage $V_{CC}$ and the node N11, and the resistor 12 is connected between the node N11 and a grounding terminal.

The transistor 200 has its collector connected to the power supply terminal through the resistor 13, and is connected to an output terminal NO through the capacitor 17. The transistor 200 has its emitter connected to the grounding terminal through the resistor 14, and is connected to the grounding terminal through the resistor 15 and the capacitor 18. An input signal is fed to the input terminal NI, and an amplified output signal is outputted from the output terminal NO.

A DC bias point of the transistor 200 shown in FIG. 18 is determined by a resistance value $R_1$ of the resistor 11, a resistance value $R_2$ of the resistor 12, a resistance value $R_C$ of the resistor 13, a resistance value $R_E$ of the resistor 14, and the power supply voltage $V_{CC}$. As the DC bias point of the transistor 200, a base voltage $V_B$, an emitter voltage $V_E$, a collector voltage $V_C$, and a collector current $I_C$ are considered. First, the base voltage $V_B$ is expressed by the following equation:

$$V_B = R_2 \cdot V_{CC}/(R_1+R_2) \quad (1)$$

The emitter voltage $V_E$ is expressed by the following equation:

$$V_E = V_B - V_{BE} \quad (2)$$

where $V_{BE}$ is a voltage between the base and the emitter. The voltage $V_{BE}$ between the base and the emitter is generally constant, for example, approximately 0.6 to 0.7 V. Further, an emitter current $I_E$ is expressed by the following equation:

$$I_E = V_E/R_E \quad (3)$$

A base current $I_B$ becomes a value significantly smaller than the collector current $I_C$ and the emitter current $I_E$, and is generally approximately one-hundredth the collector current $I_C$ and the emitter current $I_E$. Therefore, $I_E = I_C$ in an approximate manner. Consequently, the following equation (4) holds:

$$V_C = V_{CC} - I_C R_C \quad (4)$$

In the amplifier shown in FIG. 18, if it is assumed that $V_{CC}=15$ [V], $V_{BE}=0.6$ [V], $R_1=100$ [k$\Omega$], $R_2=12$ [k$\Omega$], $R_E=1$ [k$\Omega$], and $R_C=10$ [k$\Omega$], the DC bias point of the transistor 200 is $V_B=1.6$ [V], $V_E=1.0$ [V], $I_E=I_C=1.0$ [mA], and $V_C=5$ [V].

Then consider voltage gain in the amplifier shown in FIG. 18. If the capacitance value $C_E$ of the capacitor 18 inserted on the side of the emitter of the transistor 200 is large, and its impedance is sufficiently small, voltage gain $A_V$ in a low frequency region of the amplifier is expressed by the following equation:

$$A_V = R_C/R_X \quad (5)$$

where $R_X$ is a composite resistance value of the resistors 14 and 15 which are connected in parallel, and is expressed by the following equation:

$$R_X = R_E \cdot R_{EE}/(R_E+R_{EE})$$

The voltage gain $A_V$ in the low frequency region of the amplifier is determined by the ratio of the resistance value $R_C$ of the resistor 13 to the composite resistance value $R_X$ of the resistors 14 and 15 which are connected in parallel, and does not depend on the DC bias point. In the above-mentioned bias conditions, the voltage gain $A_V$ in direct current is 10. If the resistance value $R_{EE}$ of the resistor 15 is taken as 1 k$\Omega$, for example, however, the voltage gain $A_V$ in the low frequency region is 20.

In order to prevent the voltage gain $A_V$ in the low frequency region from being reduced in the above-mentioned amplifier, however, the capacitor 18 having a large capacitance value $C_E$ must be used. In a case where the amplifier shown in FIG. 18 is constituted by an integrated circuit, therefore, when a capacitor having an MIM (Metal-Insulator-Metal) structure having a relatively large capacitance value per unit area is used as the capacitor 18, the occupied area thereof is increased. Accordingly, the amplifier cannot be miniaturized.

In the actual amplifier, a mirror effect is produced. Accordingly, the gain thereof in a high frequency region is reduced. Here, the mirror effect is such a phenomenon that when a capacitor is connected to an input terminal and an output terminal of the amplifier, a case where the capacitance value of the capacitor is small is equivalent to a case where a capacitor having a large capacitance value is connected, as viewed from the input side.

Generally in the bipolar transistor, an internal parasitic capacitance exists between a base and a collector. The capacitance value of the internal parasitic capacitance is increased due to the mirror effect. An internal resistance in the transistor, for example, a base parasitic resistance and the internal parasitic capacitance equivalently increased due to the mirror effect form a low-pass filter. The low-pass filter exerts adverse effects such as the reduction of the gain in the high frequency region.

The effect of the mirror effect in the amplifier shown in FIG. 18 will be described. FIG. 19 is an equivalent circuit diagram of the amplifier in a case where the transistor is represented by a hybrid $\pi$-type equivalent circuit. FIG. 20 is an equivalent circuit diagram of the amplifier in a case where consideration is given to the mirror effect.

In FIGS. 19 and 20, $r_b$ and $r\pi$ indicate internal parasitic resistances in the transistor 200, and $C\pi$ and $C_C$ indicate internal parasitic capacitances in the transistor 200. The internal parasitic capacitance $C_C$ between the base and the collector is a capacitance value which is multiplexed by $(A_V+1)$ due to the mirror effect. Consequently, the frequency characteristics $A_V(f)$ of the voltage gain in the amplifier is expressed by the following equation in an approximate manner:

$$A_V(f)=A_V/(1+j\omega C_T r_T) \quad (6)$$

where f is a frequency, and ω is an angular frequency. Further, $C_T$ and $r_T$ in the foregoing equation (6) are expressed by the following equation:

$$C_T=C\pi+C_C(1+gmR_L)=C\pi+(1+A_V)\cdot C_C$$

$$r_T=r_b\cdot r\pi/(r_b+r\pi)$$

where gm is a mutual inductance of the transistor 200. Further, the frequency $f_C$ which is lowered to 3 dB (=1/√2), as compared with the voltage gain $A_V$ in the low frequency region, is expressed by the following equation (7):

$$f_C=1/(2\pi C_T r_T) \quad (7)$$

The frequency characteristics of the wide-band amplifier is thus limited by the frequency $f_C$. When the foregoing equation (6) is rewritten using the foregoing equation (7), the following equation is obtained:

$$|A_V(f)|=A_V/\{1+(f/f_C)^2\} \quad (8)$$

From the foregoing equation (8), the voltage gain is reduced when the frequency is raised. When the reduction in the gain in the high frequency region is compensated for by adjusting the capacitance value $C_E$ of the capacitor 18, the gain in the low frequency region is reduced.

On the other hand, a negative feedback amplifier comprises an amplification portion and a feedback portion. Generally, a resistor having no frequency dependency is used for the feedback portion, and the amplification portion is composed of a transistor or the like and has frequency dependency. The gain G of the negative feedback amplifier is expressed by the following equation:

$$G=A/(1-A\cdot\beta)$$

where A is open-loop gain (the gain of the amplification portion itself), and β is a feedback factor. When the open-loop gain A is reduced because the frequency is raised, the gain G of the whole negative feedback amplifier is reduced. In the wide-band amplifier or the like, therefore, the upper-limit frequency is limited.

In order to solve this, a method of decreasing a feedback amount as the frequency is increased by constituting the feedback portion by a capacitance, an inductance, and a resistance has been known. When such an inductive or capacitive element is used, however, the phase of a feedback signal varies depending on the frequency. Accordingly, the feedback portion enters a positive feedback state at a predetermined frequency, thereby causing problems. For example, the stability of the amplifier is degraded.

An object of the present invention is to provide a high frequency circuit capable of controlling characteristics in a high frequency region with a small occupied area and without degrading characteristics in a low frequency region.

SUMMARY OF THE INVENTION

An object of the present invention is to provide a high frequency circuit capable of controlling gain in a high frequency region without using a capacitor having a large occupied area and reducing gain in a low frequency region.

Still another object of the present invention is to provide a high frequency circuit whose frequency characteristics are improved without degrading stability.

A high frequency circuit according to an aspect of the present invention comprises a transistor having a first terminal receiving an input signal and having a second terminal and a third terminal; a first circuit connected to the second terminal of the transistor; and a second circuit connected to the third terminal of the transistor, at least one of the first and second circuits comprising one or a plurality of thin film resistors.

The thin film resistor has such characteristics that the film thickness thereof is relatively small, and the resistance value thereof is increased by a skin effect if the frequency thereof is increased. The skin effect is such a phenomenon that when a high frequency current flows through a conductor or a resistor, the high frequency current flows in such a manner as to be concentrated on its surface part. A skin depth is an index representing the skin effect. The skin depth δ is expressed by the following equation:

$$\delta = \sqrt{\frac{1}{\pi\mu_0 \sigma f}} \quad (9)$$

where $\mu_0$ is permeability in a vacuum (=4π×10⁻⁷), σ is the conductivity of a material for the thin film resistor, and ρ is the resistivity of the material for the thin film resistor.

When the thin film resistor is composed of Au (gold), for example, the skin depth δ at a frequency of 20 GHz is approximately 1 μm. The resistance value of the thin film resistor at a particular frequency decreases as the film thickness thereof increases, and is almost saturated in a thickness which is approximately three times the skin depth. That is, if the film thickness of the thin film resistor is set to approximately the skin depth, a resistor whose resistance value varies depending on the frequency can be realized. A surface resistance in the thin film resistor is expressed by the following equation:

$$R_S(f) = \frac{\sqrt{\pi\mu_0 \sigma f} \times \rho}{1 - \exp(-t\sqrt{\pi\mu_0 \sigma f})} \quad (10)$$

where t is the film thickness of the thin film resistor. From the foregoing equation (10), the surface resistance in the thin film resistor has frequency dependency using conductivity σ and a film thickness t which are peculiar to the material as parameters.

In the high frequency circuit according to the present invention, at least one of the first circuit connected to the second terminal of the transistor and the second circuit connected to the third terminal of the transistor comprises one or a plurality of thin film resistors. Consequently, the characteristics of at least one of the first and second circuits depend on the frequency. Consequently, it is possible to control the characteristics in the high frequency region with a small occupied area and without degrading the characteristics in the low frequency region.

The first circuit may be connected between the second terminal of the transistor and a power supply terminal receiving a power supply voltage, and the second circuit may be connected between the third terminal of the transistor and a grounding terminal receiving a grounding potential.

In this case, at least one of the first circuit connected between the second terminal of the transistor and the power supply terminal and the second circuit connected between the third terminal of the transistor and the grounding terminal comprises one or a plurality of thin film resistors. Consequently, the resistance value of at least one of the first and second circuits has frequency dependency. As a result, the gain of the transistor in the high frequency region depends on the frequency. Consequently, it is possible to control the gain in the high frequency region without using a capacitor having a large occupied area and without reducing the gain in the low frequency region.

At least one of the first and second circuits may comprise a series connection of one or a plurality of thin film resistors and the one or a plurality of resistors having no frequency dependency.

In this case, it is possible to obtain arbitrary frequency characteristics by combining the thin film resistors and the resistors having no frequency dependency.

At least one of the first and second circuits may comprise a parallel connection of one or a plurality of thin film resistors and the one or a plurality of resistors having no frequency dependency.

In this case, it is possible to obtain arbitrary frequency characteristics by combining the thin film resistors and the resistors having no frequency dependency.

The first circuit may have a feedback circuit for feeding back a signal at the second terminal of the transistor to the first terminal, and the feedback circuit may comprise the one or plurality of thin film thin film resistors.

In this case, the feedback circuit for feeding back the signal at the second terminal of the transistor to the first terminal comprises one or a plurality of thin film resistors. Consequently, it is possible to control the frequency characteristics of the feedback factor of the feedback circuit without changing the phase of a feedback signal of the feedback circuit. Consequently, it is possible to improve high frequency characteristics without degrading stability. The high frequency circuit may further comprise one or a plurality of other transistors, and the feedback circuit may feed back a signal at the second terminal to the first terminal through the one or plurality of other transistors.

In this case, in a feedback amplifier comprising transistors in a plurality of stages, it is possible to improve high frequency characteristics without degrading stability.

The feedback circuit may have a feedback path for applying a part of a voltage signal at the second terminal to the first terminal in series, and the feedback path may comprise the one or plurality of thin film resistors and one or plurality of resistors having no frequency dependency. In this case, in a voltage-series feedback amplifier, it is possible to improve high frequency characteristics without degrading stability.

The feedback circuit may have a feedback path comprising a conversion portion for converting a part of a current signal at the second terminal into a voltage signal and an application portion for applying the voltage signal obtained by the conversion portion to the first terminal in series, and the feedback path may comprise the one or plurality of thin film resistors and one or plurality of resistors having frequency dependency.

In this case, in a current-series feedback amplifier, it is possible to improve high frequency characteristics without degrading stability.

The feedback circuit may have a feedback path comprising a conversion portion for converting a voltage signal at the second terminal into a current signal and an application portion for applying the current signal obtained by the conversion portion to the first terminal in parallel, and the feedback path may comprise the one or plurality of thin film resistors and one or plurality of resistors having no frequency dependency.

In this case, in a voltage-parallel feedback amplifier, it is possible to improve high frequency characteristics without degrading stability.

The feedback circuit may have a feedback path for applying a part of a current signal at the second terminal to the first terminal in parallel, and the feedback path may comprise the one or plurality of thin film resistors and one or plurality of resistors having no frequency dependency. In this case, in the voltage-parallel feedback amplifier, it is possible to improve high frequency characteristics without degrading stability.

The feedback circuit may have a first feedback path for applying a part of a voltage signal at the second terminal to the first terminal in series and a second feedback path for applying a part of a current signal at the second terminal to the first terminal in parallel, and each of the first feedback path and the second feedback path may comprise the one or plurality of thin film resistors and one or plurality of resistors having no frequency dependency.

In this case, in a feedback amplifier which is a combination of the voltage-series feedback amplifier and the current-parallel feedback amplifier, it is possible to improve high frequency characteristics without degrading stability.

The one or plurality of thin film resistors may have a film thickness smaller than three times its skin depth at a predetermined frequency. In this case, the resistance value of the feedback register depends on the frequency by the skin effect. Consequently, it is possible to control the gain at the predetermined frequency.

The one or plurality of thin film resistors may have a thickness of not more than the skin depth at the predetermined frequency. In this case, the resistance value of the feedback register has significant frequency dependency. In this case, it is possible to sufficiently control the gain at the predetermined frequency.

The transistor may be a bipolar transistor. Alternatively, the transistor may be a field effect transistor.

The one or plurality of thin film resistors may be formed of a thin film of a metal or a metal compound. The one or a plurality of resistors having no frequency dependency are composed of a semiconductor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing the configuration of an emitter grounded wide-band amplifier in a first embodiment of the present invention;

DESCRIPTION OF THE PREFERRED EMBODIMENTS

Figure 2:
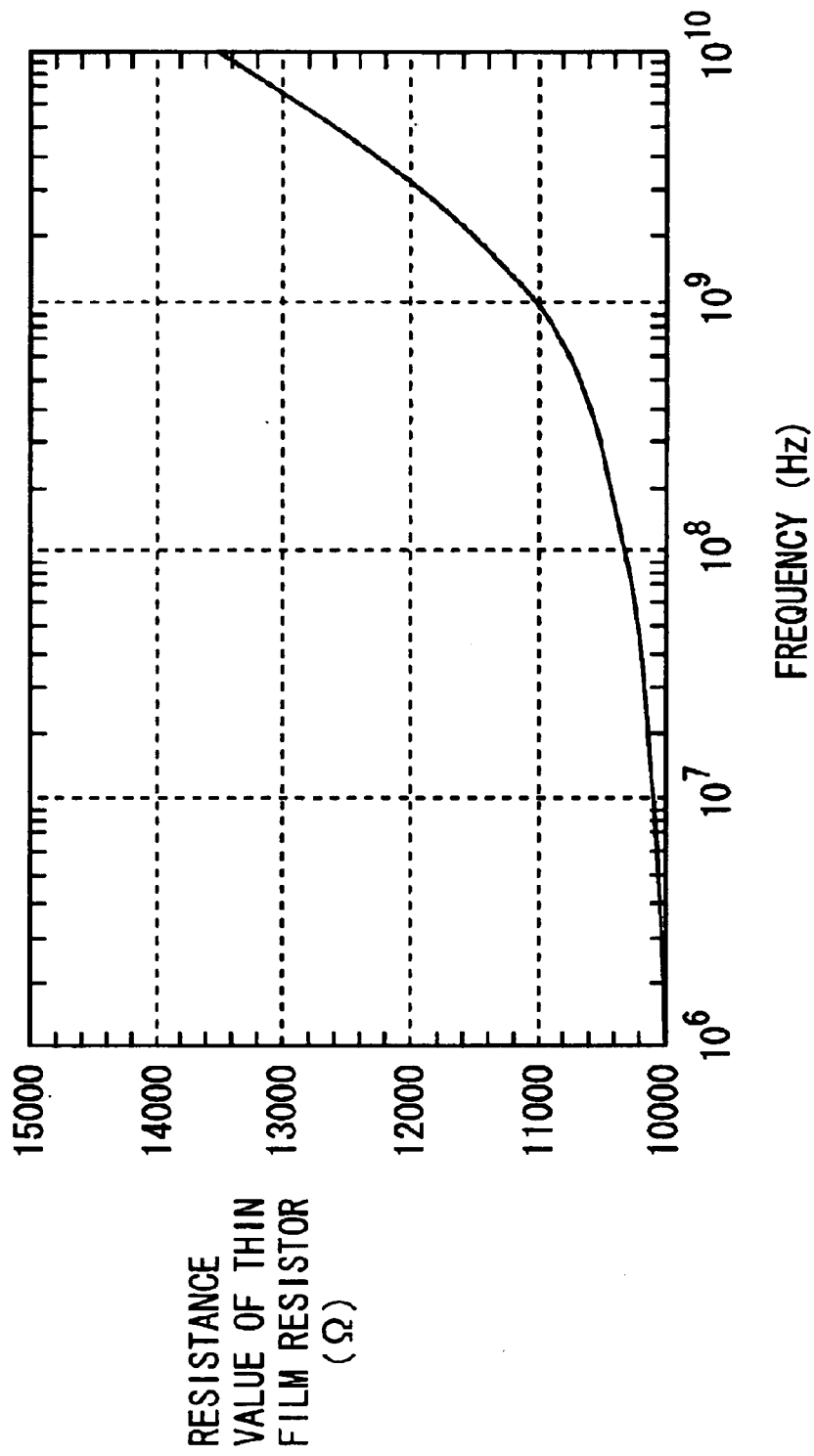
FIG. 2 is a diagram showing the frequency dependency of the resistance value of a thin film resistor used for the amplifier shown in FIG. 1.

Description is now made of a wide-band amplifier as an example of a high frequency circuit according to the present invention.

(1) First Embodiment

FIG. 1 is a circuit diagram of an emitter grounded wide-band amplifier in a first embodiment of the present invention.

The amplifier shown in FIG. 1 comprises an NPN-type bipolar transistor (hereinafter abbreviated as a transistor) 100, resistors 1 and 2, a first circuit 3, a second circuit 4, and capacitors 5 and 6. In the present embodiment, the first circuit 3 functions as a compensating circuit for compensating for the frequency characteristics of voltage gain.

The resistors 1 and 2 are formed by a semiconductor resistor or the like capable of almost ignoring frequency dependency. The first circuit 3 is constituted by a thin film resistor 30 having frequency dependency. Further, the second circuit 4 is constituted by a semiconductor resistor 40 capable of almost ignoring frequency dependency. The thin film resistor 30 is formed of a thin film of a metal or a metal compound, for example. Further, the semiconductor resistor 40 is formed by ion-implanting impurities into a semiconductor, for example.

The transistor 100 has its base connected to a node N1, and the node N1 is connected to an input terminal NI through the capacitor 5. The resistor 1 is connected between a power supply terminal receiving a power supply voltage $V_{CC}$ and the node N1, and the resistor 2 is connected between the node N1 and a grounding terminal. The transistor 100 has its collector connected to the power supply terminal through the first circuit 3, and is connected to an output terminal NO through the capacitor 6. The transistor 100 has its emitter connected to the grounding terminal through the second circuit 4. An input signal is fed to the input terminal NI, and an amplified output signal is outputted from the output terminal NO.

In the amplifier shown in FIG. 1, a DC bias point of the transistor 100 is determined by the power supply voltage $V_{CC}$, the resistance value $R_1$ of the resistor 1, the resistance value $R_2$ of the resistor 2, the resistance value $R_E$ of the semiconductor resistor 40 in the second circuit 4, and the resistance value $R_{S0}$ in direct current of the thin film resistor 30 in the first circuit 3. The resistance value $R_{S0}$ in direct current of the thin film resistor 30 is expressed by the following equation:

$$R_{S0}=L/(W \cdot t \cdot \sigma) \quad (11)$$

where σ is the conductivity of a material for the thin film resistor 30, L is the length of the thin film resistor 30, W is the width of the thin film resistor 30, and t is the film thickness of the thin film resistor 30. The resistance value $R_{S0}$ in direct current of the thin film resistor 30 is given by the material for the thin film resistor 30 (conductivity σ) and the shape thereof (length L, width W, and film thickness t). A DC bias is determined using the resistance values $R_1$, $R_2$, $R_E$, and $R_{S0}$.

Furthermore, voltage gain $A_V(f)$ in a high frequency region is expressed by the following equation (see IEEE TRANSACTIONS ON MICROWAVE THEORY AND TECHNIQUES, VOL 37, NO. 10, October 1989, pp. 241–247):

$$A_V(f) = \frac{RN_1(f)}{RN_2(f)} = \frac{R_S(f)}{R_E} \quad (12)$$

$$= \frac{\sqrt{\pi \mu_0 \sigma f} \, \rho / \left[1 - \exp(-t\sqrt{\pi \mu_0 \sigma f})\right]}{R_E} \times \frac{L}{W}$$

where $RN_1(f)$ is a composite resistance value of resistors constituting the first circuit 3, and $RN_2(f)$ is a composite resistance value of resistors constituting the second circuit 4. In the present embodiment, a composite resistance value $RN_1(f)$ in the first circuit 3 is the resistance value $R_S(f)$ of the thin film resistor 30, and a composite resistance value $RN_2(f)$ in the second circuit 4 is the resistance value $R_E$ of the semiconductor resistor 40. f is a frequency, $\mu_0$ is permeability (=$4\pi \times 10^{-7}$) in a vacuum, σ is the conductivity of the material for the thin film resistor 30, and ρ is the resistivity of the material for the thin film resistor 30.

As can be seen from the foregoing equation (12), voltage gain $A_V(f)$ in the amplifier depends on the material for the thin film resistor 30 (conductivity σ) and the shape thereof (length L, width W, and film thickness t). Consequently, it is possible to obtain desired voltage gain $A_V(f)$ by changing the material for the thin film resistor 30 and the shape thereof.

When the reduction in the voltage gain $A_V(f)$ at a particular frequency is compensated for, the film thickness of the thin film resistor 30 is set to a thickness smaller than three times its skin depth at the frequency. Preferably, the film thickness of the thin film resistor 30 is set to not more than its skin depth at a frequency to be compensated for. Consequently, it is possible to compensate for the reduction in the voltage gain $A_V(f)$ at the frequency.

FIG. 2 is a diagram showing an example of frequency dependency of the resistance value of the thin film resistor 30. In the example, a Ta (tantalum) based $Ta_2N$ (tantalum nitride) superior in stability is used as the material for the thin film resistor 30. The resistivity $\rho$ of $Ta_2N$ is $250 \times 10^{-6}$ $\Omega$cm. The film thickness t of the thin film resistor 30 is 0.5 $\mu$m, the width W thereof is 1 $\mu$m, and the length L thereof is 2000 $\mu$m.

As shown in FIG. 2, the resistance value of the thin film resistor 30 is approximately 10 k$\Omega$ at 1 MHz, is approximately 11 k$\Omega$ at 1 GHz, and is approximately 13.4 k$\Omega$ at 10 GHz.

Figure 3:
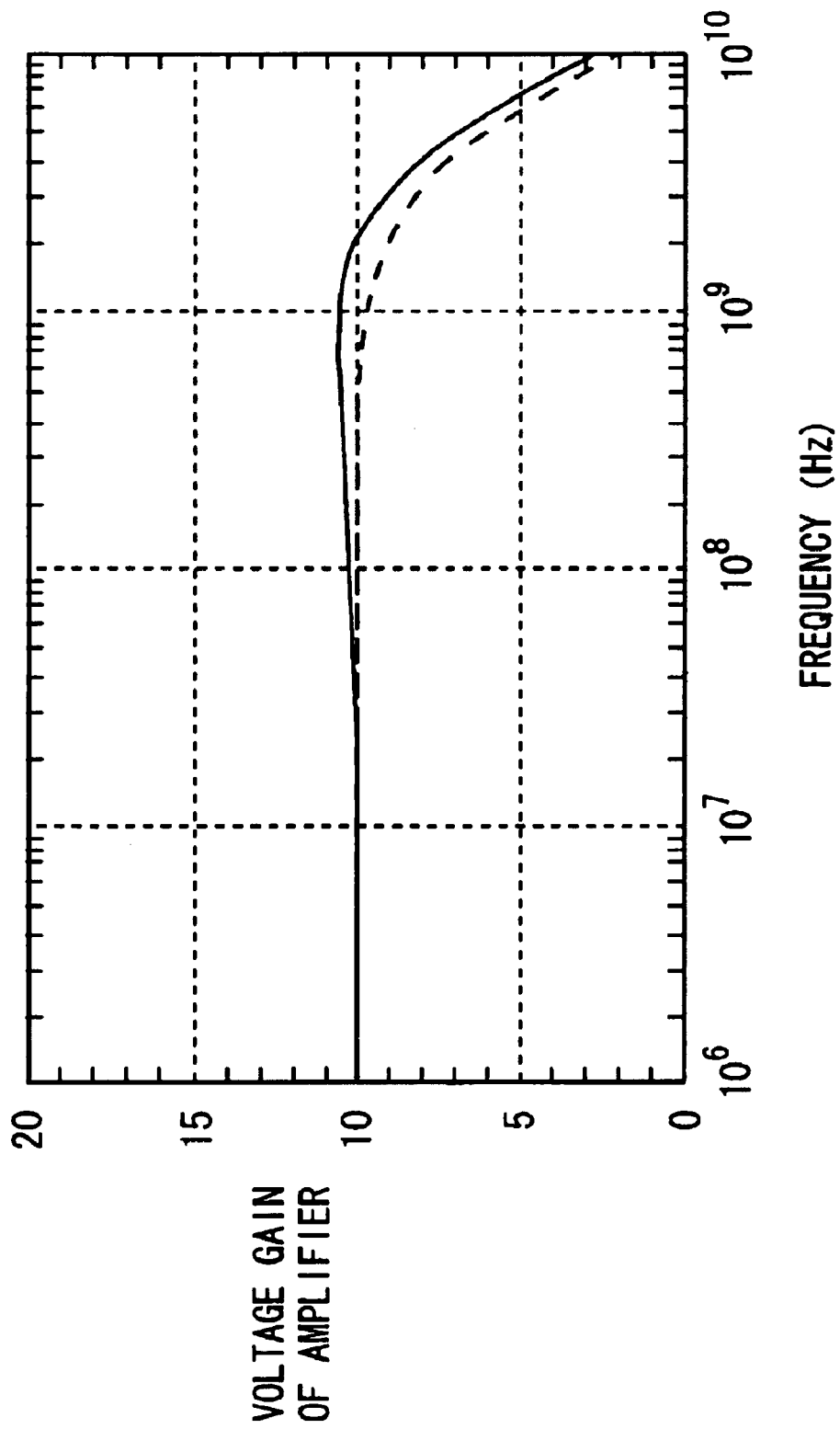
FIG. 3 is a diagram showing the frequency characteristics of voltage gain in the amplifier shown in FIG. 1.

FIG. 3 is a diagram showing the frequency characteristics of the voltage gain in the amplifier according to the first embodiment. In FIG. 3, a solid line indicates the frequency dependency of the voltage gain in the amplifier according to the present embodiment, and a broken line indicates the frequency dependency of the voltage gain in a case where the first circuit 3 which is constituted by the thin film resistor 30 in the amplifier shown in FIG. 1 is replaced with a normal resistor having no frequency dependency. A high frequency cut-off frequency $f_C$ in this case is 5 GHz.

The resistance value $R_S(f)$ of the thin film resistor 30 in the first circuit 3 has frequency dependency shown in FIG. 2. The resistance value $R_E$ of the semiconductor resistor 40 in the second circuit 4 is taken as 1 k$\Omega$.

As shown in FIG. 3, when the normal resistor is used between the collector of the transistor 100 shown in FIG. 1 and the power supply terminal, the voltage gain is reduced due to the mirror effect in the high frequency region of not less than 1 GHz. Contrary to this, when the first circuit 3 which is constituted by the thin film resistor 30 is used between the collector of the transistor 100 and the power supply terminal, the reduction in the gain in the high frequency region of not less than 1 GHz is improved.

In the amplifier according to the present embodiment, the first circuit 3 is constituted by the thin film resistor 30, thereby making it possible to control the frequency characteristics of the voltage gain without using a capacitor having an MIM structure having a large occupied area on an integrated circuit and having complicated processes and without reducing voltage gain in the low frequency region.

In this case, the frequency characteristics of the voltage gain are determined by the material for the thin film resistor 30 and the shape thereof. Consequently, it is possible to set desired voltage gain at a particular frequency by changing the material for the thin film resistor 30 and the shape thereof.

(2) Second Embodiment

Figure 4:
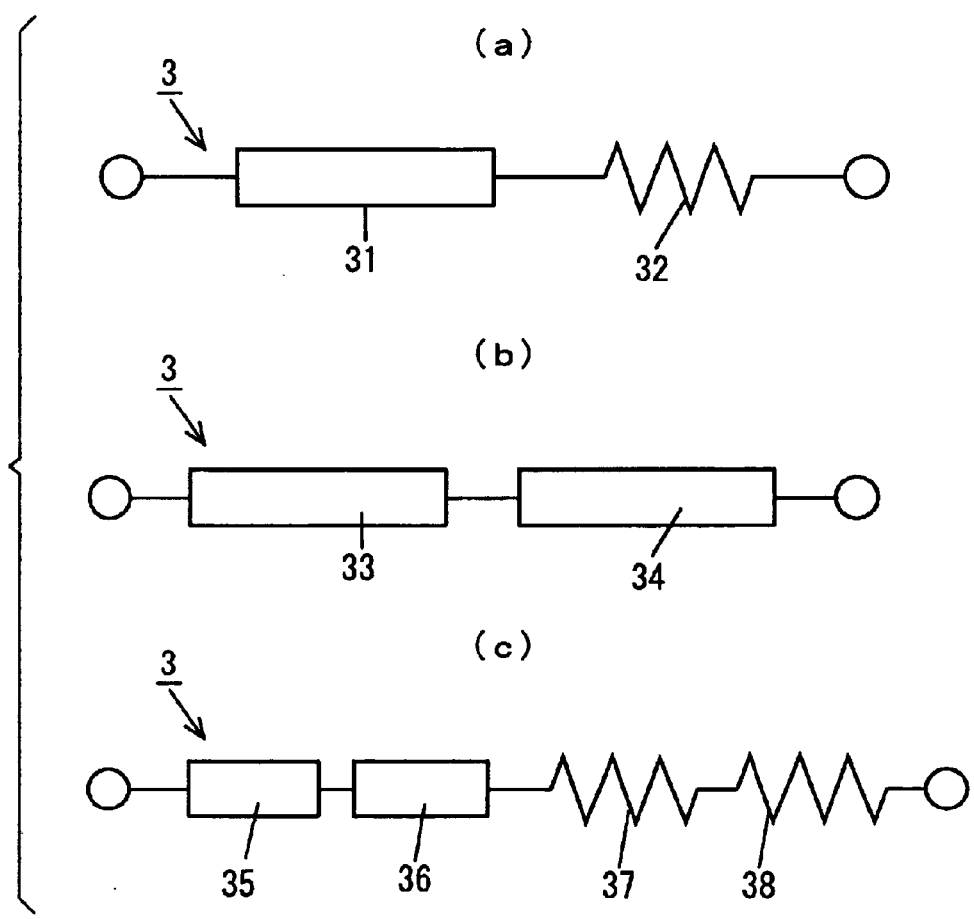
FIG. 4 is a diagram showing the configuration of a first circuit in an emitter grounded wide-band amplifier in a second embodiment of the present invention.

Description is now made of an emitter grounded wideband amplifier in a second embodiment of the present invention. The amplifier in the second embodiment is the same as the amplifier shown in FIG. 1 except that a first circuit 3 comprises a series connection of one thin film resistor 31 and one semiconductor resistor 32, as shown in FIG. 4(a). The semiconductor resistor 32 has little frequency dependency.

In the present embodiment, a composite resistance value $RN_1(f)$ in the first circuit 3 in the foregoing equation (12) is expressed by the following equation:

$$RN_1(f) = R_S(f) + R \quad (13)$$

where $R_S(f)$ is the resistance value of the thin film resistor 31, and R is the resistance value of the semiconductor resistor 32.

Figure 5:
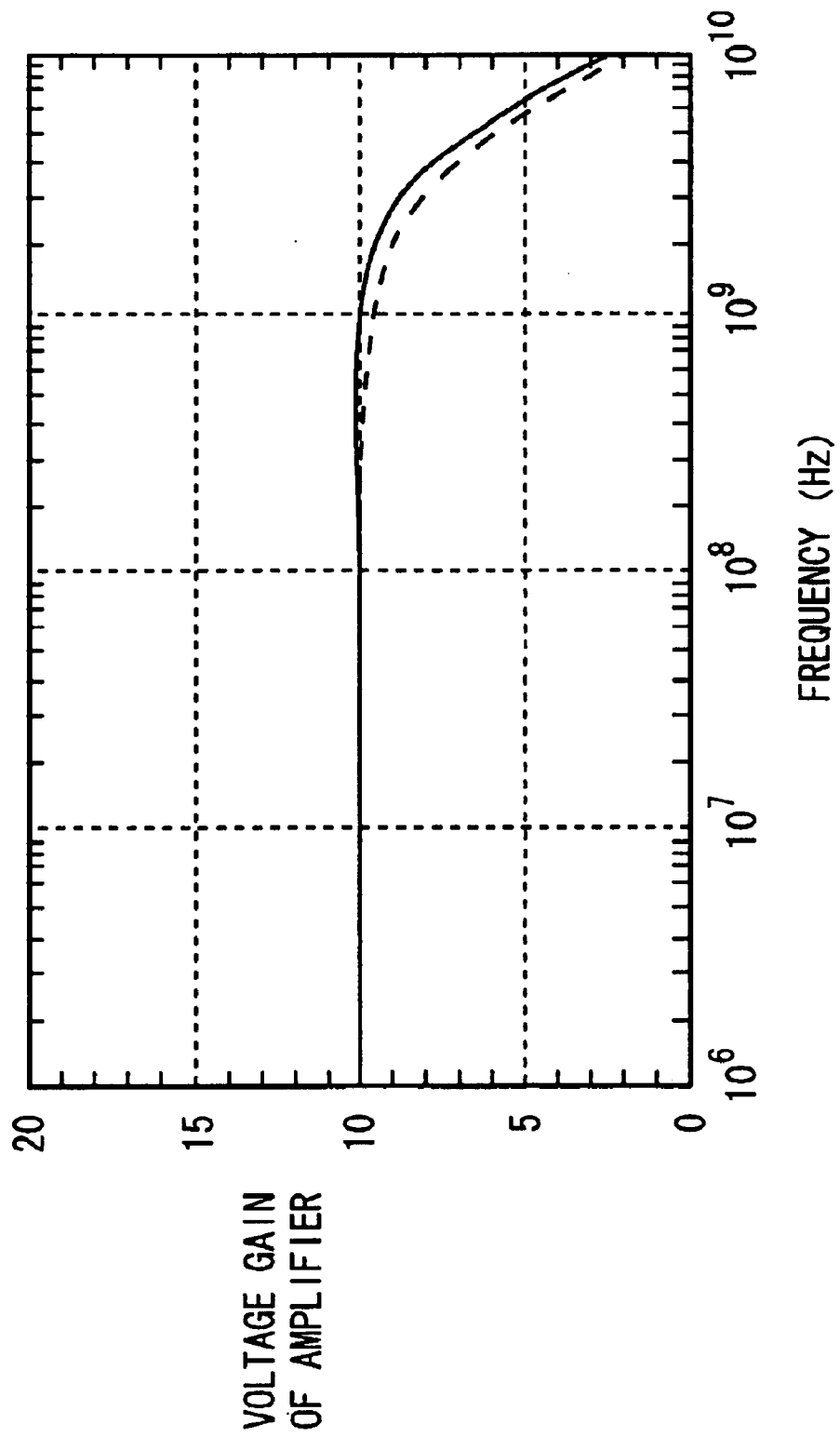
FIG. 5 is a diagram showing the frequency characteristics of voltage gain in an amplifier in the second embodiment.

FIG. 5 is a diagram showing the frequency characteristics of voltage gain in the amplifier according to the second embodiment. In FIG. 5, a solid line indicates the frequency dependency of the voltage gain in the amplifier according to the present embodiment, and a broken line indicates the frequency dependency of the voltage gain in a case where the first circuit 3 in the amplifier shown in FIG. 1 is replaced with a normal resistor having no frequency dependency. A high frequency cut-off frequency in this case is 5 GHz.

A material for the thin film resistor 31 shall be $Ta_2N$. In this case, the resistivity $\rho$ of $Ta_2N$ is $250 \times 10^{-6}$ $\Omega$cm. The film thickness t of the thin film resistor 31 is set to 0.5 $\mu$m, the width W thereof is set to 1 $\mu$m, and the length L thereof is set to 1000 $\mu$m. The resistance value of the semiconductor resistor 32 is taken as 5 k$\Omega$. Further, the resistance value $R_E$ of the semiconductor resistor 40 in the second circuit 4 is taken as 1 k$\Omega$.

When a first circuit 3 which is constituted by a series connection of the thin film resistor 31 and the semiconductor resistor 32 shown in FIG. 4(a) is used between the collector of the transistor 100 and the power supply terminal, as shown in FIG. 5, the reduction in the voltage gain in the high frequency region of not less than 1 GHz is improved, as compared with that in a case where the normal resistor is used.

In the amplifier according to the present embodiment, the first circuit 3 thus comprises the series connection of the thin film resistor 31 and the semiconductor resistor 32, thereby making it possible to control the frequency characteristics of the voltage gain without using a capacitor having an MIM structure having a large occupied area on an integrated circuit and having complicated processes and without reducing voltage gain in a low frequency region.

In this case, the frequency characteristics of the voltage gain are determined by the material for the thin film resistor 30 and the shape thereof. Consequently, it is possible to set desired voltage gain at a particular frequency by changing the material for the thin film resistor 30 and the shape thereof.

In the amplifier according to the present embodiment, the first circuit 3 may comprise a series connection of a plurality of thin film resistors 33 and 34, as shown in FIG. 4(b). Further, in the amplifier according to the present embodiment, the first circuit 3 may comprise a series connection of a plurality of thin film resistors 35 and 36 and a plurality of semiconductor resistors 37 and 38, as shown in FIG. 4(c).

Furthermore, the semiconductor resistor 32 shown in FIG. 4(a) and the semiconductor resistors 37 and 38 shown in FIG. 4(c) may be replaced with other resistors having little frequency dependency.

One or a plurality of thin film resistors and one or a plurality of resistors having little frequency dependency are arbitrarily connected in series, thereby making it possible to obtain various frequency characteristics in the amplifier.

(3) Third Embodiment

Description is now made of an emitter grounded wideband amplifier in a third embodiment of the present invention. The amplifier in the third embodiment is the same as the amplifier shown in FIG. 1 except that a first circuit 3 comprises a parallel connection of a thin film resistor 31 and a semiconductor resistor 32, as shown in FIG. 6(a). The semiconductor resistor 32 has little frequency dependency.

In the present embodiment, a composite resistance value $RN_1(f)$ in the first circuit 3 in the foregoing equation (12) is expressed by the following equation:

$$RN_1(f) = R_S(f) \times R / \{R_S(f) + R\} \quad (14)$$

where $R_S(f)$ is the resistance value of the thin film resistor 31, and R is the resistance value of the semiconductor resistor 32.

Figure 7:
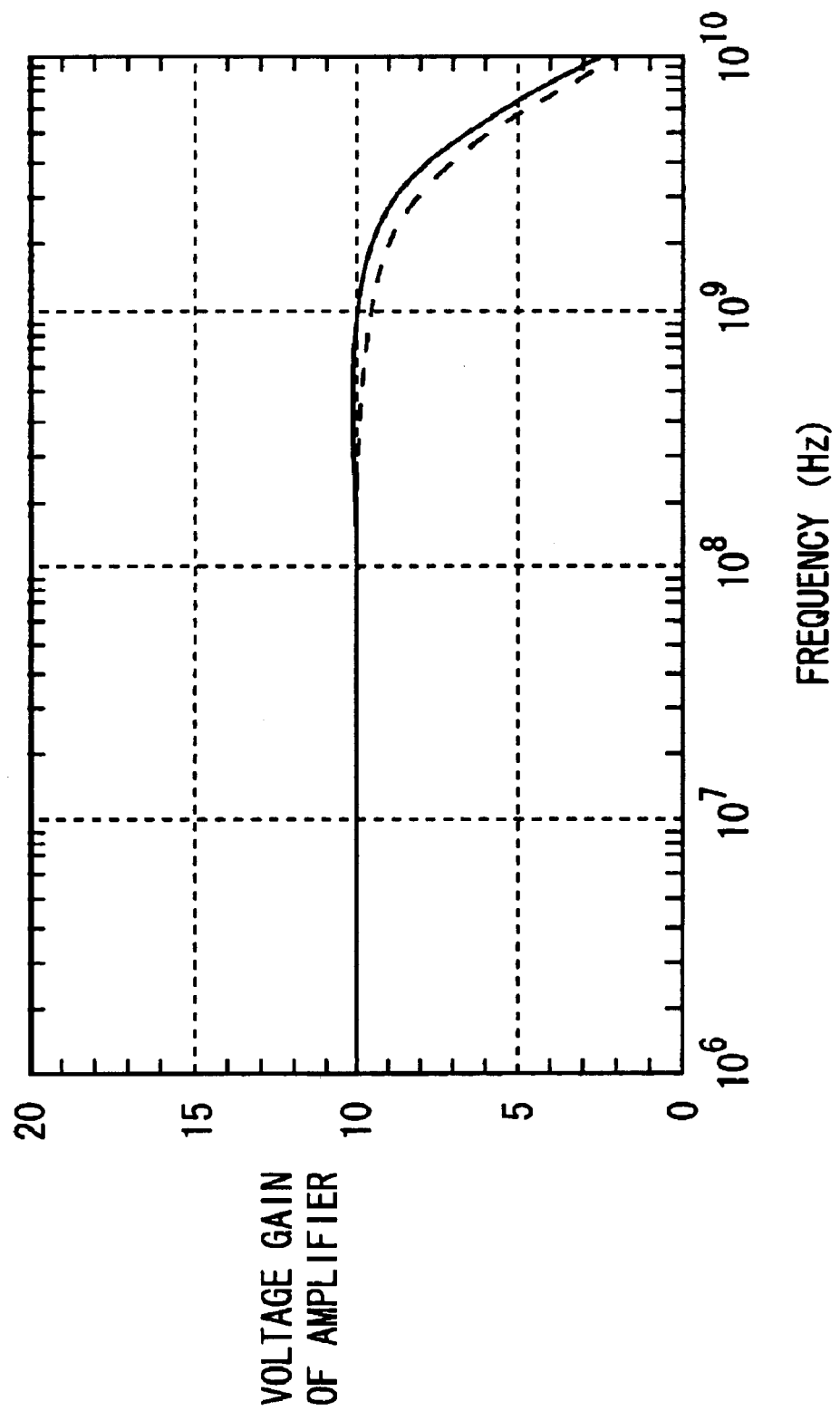
FIG. 7 is a diagram showing the frequency characteristics of voltage gain in an amplifier in the third embodiment.

FIG. 7 is a diagram showing the frequency characteristics of voltage gain in the amplifier according to the present embodiment. In FIG. 7, a solid line indicates the frequency dependency of the voltage gain in the amplifier according to the present embodiment, and a broken line indicates the frequency dependency of the voltage gain in a case where the first circuit 3 in the amplifier shown in FIG. 1 is replaced with a normal resistor having no frequency dependency. A high frequency cut-off frequency in this case is 5 GHz.

A material for the thin film resistor 31 shall be $Ta_2N$. In this case, the resistivity $\rho$ of $Ta_2N$ is $250 \times 10^{-6} \Omega cm$. The film thickness t of the thin film resistor 31 is set to 0.5 $\mu m$, the width W thereof is set to 1 $\mu m$, and the length L thereof is set to 4000 $\mu m$. The resistance value R of the semiconductor resistor 32 is taken as 20 k$\Omega$. Further, the resistance value $R_E$ of the semiconductor resistor 40 in the second circuit 4 is taken as 1 k$\Omega$.

When a first circuit 3 comprising a parallel connection of the thin film resistor 31 and the semiconductor resistor 32 is used between the collector of the transistor 100 and the power supply terminal, as shown in FIG. 7, the reduction in the voltage gain in the high frequency region of not less than 1 GHz is improved, as compared with that in a case where a normal resistor is used.

In the amplifier according to the present embodiment, the first circuit 3 thus comprises the parallel connection of the thin film resistor 31 and the semiconductor resistor 32, thereby making it possible to control the frequency characteristics of the voltage gain without using a capacitor having an MIM structure having a large occupied area on an integrated circuit and having complicated processes and without reducing voltage gain in a low frequency region.

In this case, the frequency characteristics of the voltage gain are determined by the material for the thin film resistor 30 and the shape thereof. Consequently, it is possible to set desired voltage gain at a particular frequency by changing the material for the thin film resistor 30 and the shape thereof.

Figure 6:
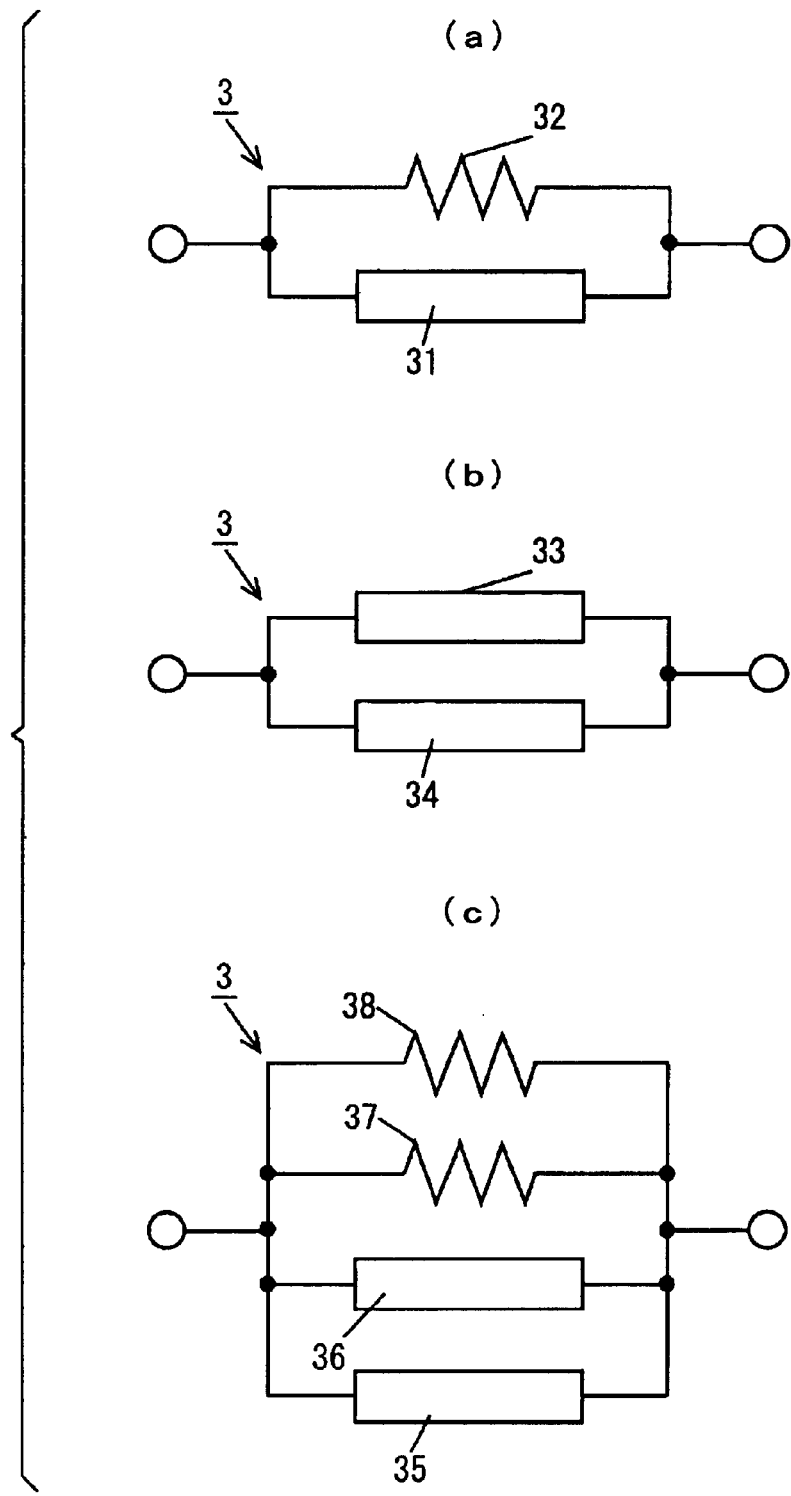
FIG. 6 is a circuit diagram showing an example of a first circuit of an emitter grounded wide-band amplifier in a third embodiment of the present invention.

In the amplifier according to the present embodiment, the first circuit 3 comprises a parallel connection of a plurality of thin film resistors 33 and 34, as shown in FIG. 6(*b*). Further, in the amplifier according to the present embodiment, the first circuit 3 may comprise a parallel connection of a plurality of thin film resistors 35 and 36 and a plurality of semiconductor resistors 37 and 38, as shown in FIG. 6(*c*).

Furthermore, the semiconductor resistor 32 shown in FIG. 6(*a*) and the semiconductor resistors 37 and 38 shown in FIG. 6(*c*) may be replaced with other resistors having little frequency dependency.

One or a plurality of thin film resistors and one or a plurality of resistors having little frequency dependency are arbitrarily connected in parallel, thereby making it possible to obtain various frequency characteristics in the amplifier.

(4) Another Example of Configuration

Although in the second and third embodiments, the first circuit 3 comprises the series connection of the thin film resistor and the semiconductor resistor or the parallel connection of the thin film resistor and the semiconductor resistor, the configuration of the first circuit 3 is not limited to the configurations in the above-mentioned embodiments. For example, another circuit configuration comprising at least one thin film resistor may be used.

Although in the first, second and third embodiments, the first circuit 3 is constituted by at least one thin film resistor, the second circuit 4 may be constituted by one thin film resistor, similarly to the first circuit 3 in the first embodiment, may be constituted by a series connection of a thin film resistor and a semiconductor resistor, similarly to the first circuit in the second embodiment, or may be constituted by a parallel connection of a thin film resistor and a semiconductor resistor, similarly to the first circuit 3 in the third embodiment.

Furthermore, the first circuit 3 or the fourth circuit 4 may be constituted by a combination of a series connection and a parallel connection of one or a plurality of thin film resistors and one or a plurality of semiconductor resistors.

Furthermore, both of the first circuit 3 and the second circuit 4 may be constituted by at least one thin film resistor.

For example, a resistance value between the collector of a transistor 100 and a power supply terminal at a frequency $f_C$ shown in the foregoing equation (7) is multiplexed by $\sqrt{2}$ by the first circuit 3, or a resistance value between the emitter of the transistor 100 and a grounding terminal is multiplexed by $1/\sqrt{2}$ by the second circuit 4, thereby making it possible to compensate for the reduction in voltage gain of 3 dB.

It is possible to realize an amplifier whose frequency characteristics are controlled in a complicated manner by arbitrarily combining one or a plurality of thin film resistors and one or a plurality of semiconductor resistors.

Although in the first, second, and third embodiments, the first circuit 3 is constituted by a thin film resistor, to compensate for the reduction in the voltage gain in the high frequency region, it is also possible to reduce voltage gain at a desired frequency by using the thin film resistor.

Furthermore, although in the first, second and third embodiments, description was made of a case where the present invention is applied to the emitter grounded wideband amplifier, the present invention is not limited to the amplifier. For example, the present invention is also applicable to various types of high frequency circuits. In this case, it is possible to control the frequency characteristics of the high frequency circuit.

(5) Fourth Embodiment

Figure 8:
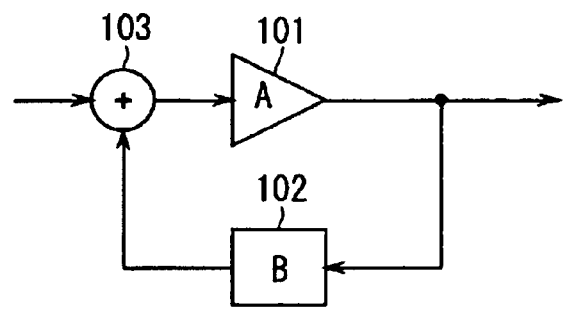
FIG. 8 is a diagram showing the principle of a negative feedback amplifier in a fourth embodiment of the present invention.

Description is now made of a negative feedback amplifier in a fourth embodiment of the present invention. FIG. 8 is a diagram showing the principle of the negative feedback amplifier in the fourth embodiment of the present invention.

As shown in FIG. 8, the negative feedback amplifier comprises an amplification portion 101, a feedback portion 102, and an addition portion 103. Let A be open-loop gain, and let $\beta$ be the feedback factor of the feedback portion 102. Let a cut-off frequency be $f_C$. Letting $A_0$ be open-loop gain in direct current, and letting f be a signal frequency, frequency dependency $A(f)$ of the open-loop gain A is expressed by the following equation:

$$|A(f)| = \frac{A_0}{\sqrt{1+(f/f_C)^2}} \qquad (15)$$

The foregoing equation (15) indicates that when the signal frequency f is equal to the cut-off frequency $f_C$, the open-loop gain A is $\sqrt{1/2}$.

Furthermore, loop gain (the gain of the feedback amplifier) $G(f)$ is expressed by the following equation if consideration is given to frequency dependency:

$$G(f)=A(f)/\{1-A(f)\cdot\beta(f)\} \qquad (16)$$

In the conventional negative feedback amplifier, a resistor having no frequency dependency is used for a feedback portion, and the feedback factor is constant with respect to the frequency. Contrary to this, in the negative feedback amplifier in the present embodiment, a thin film resistor having frequency dependency is used for the feedback portion 102, resulting in improved frequency characteristics.

Typical examples of the feedback portion include a voltage feedback portion and a current feedback portion using two resistors, and the feedback factor thereof is expressed by the following equation:

$$\beta = R/(R+R_F) \approx R/R_F \qquad (17)$$

$$R \ll R_F \qquad (18)$$

where R and $R_F$ are the resistance values of the two resistors. When a thin film resistor is used as the one resistor in the feedback portion 102, the feedback factor $\beta$ (f) is expressed by the following equation, and has frequency characteristics which depend on a material for the thin film resistor and the shape thereof:

$$\beta(f) = \frac{R}{R_F} = \frac{R}{R_S(f)} = \frac{R}{\frac{\rho}{\delta\left[1-\exp\left(-\frac{t}{\delta}\right)\right]} \times \frac{L}{W}} \qquad (19)$$

In the foregoing equation (19), $R_S$(f) is a surface resistance in the thin film resistor. σ is the conductivity of the material for the thin film resistor, and ρ is the resistivity of the material for the thin film resistor. L is the length of the thin film resistor, W is the width of the thin film resistor, and t is the film thickness of the thin film resistor. The feedback factor β(f) thus depends on the material for the thin film resistor (conductivity σ and resistivity ρ) and the shape thereof (length L, width W, and film thickness t). By adjusting the material for the thin film resistor and the shape thereof, therefore, a desired feedback factor can be obtained.

Figure 9:
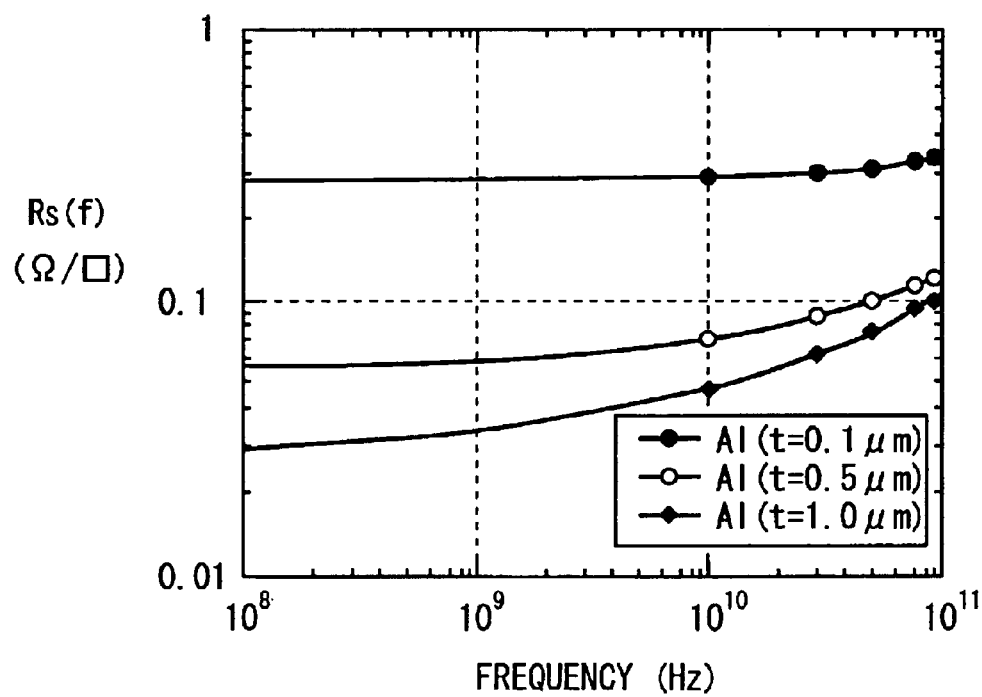
FIG. 9 is a diagram showing the frequency dependency of a surface resistance in a thin film resistor in a feedback portion.

FIG. 9 is a diagram showing the frequency dependency of the surface resistance $R_S$(f) in the thin film resistor in the feedback portion 102. In this example, Al (aluminum) is used an the material for the thin film resistor. The resistivity ρ of Al is 2.75×10$^{-6}$ Ωcm. The film thickness t of the thin film resistor is 0.1 μm, 0.5 μm, and 1.0 μm, the width W thereof is 1 μm, and the length L thereof is 200 μm.

As shown in FIG. 9, the larger the thickness of the metal film composing the thin film resistor is, the stronger the frequency dependency of the surface resistance $R_S$(f) is. Consequently, it is found that Al is suitable for a low resistance.

When a high resistance is required, a material having high resistivity ρ, for example, Ti (ρ=43.1×10$^{-6}$Ωcm) or Ta$_2$N (ρ=250×10$^{-6}$Ωcm).

Figure 10:
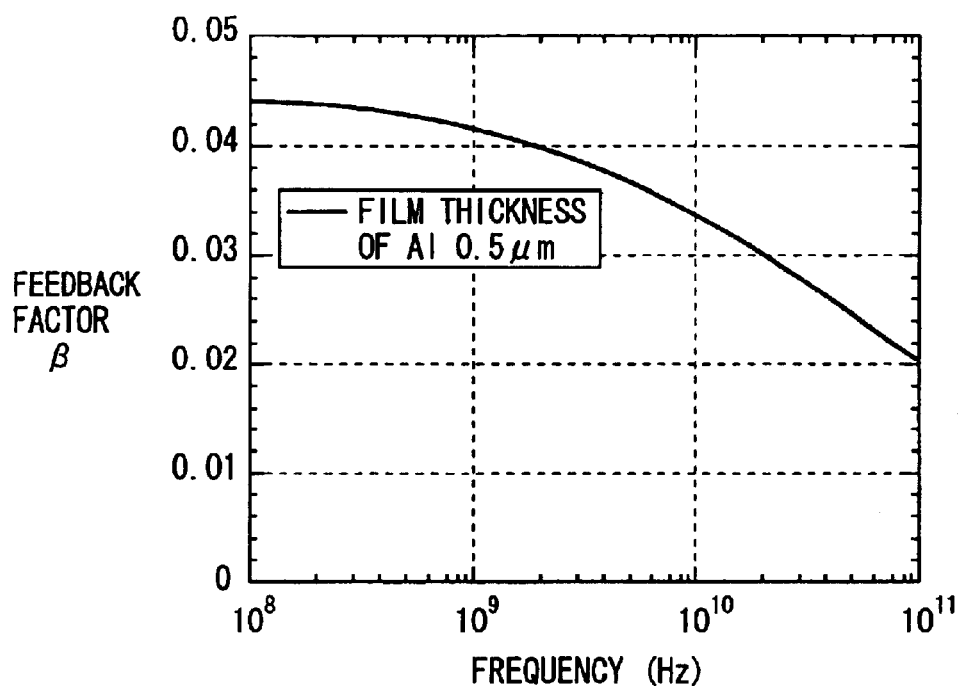
FIG. 10 is a diagram showing the frequency dependency of the feedback factor of the feedback portion.

FIG. 10 is a diagram showing frequency dependency of the feedback factor β of the feedback portion 102. In this example, Al is used as the material for the thin film resistor. The film thickness t of the thin film resistor is 0.5 μm, the width W thereof is 1 μm, and the length L thereof is 200 μm. Further, the resistance value R of the resistor having no frequency dependency is 10 Ω.

As can be seen from FIG. 10, as the frequency increases, the feedback factor decreases.

Figure 11:
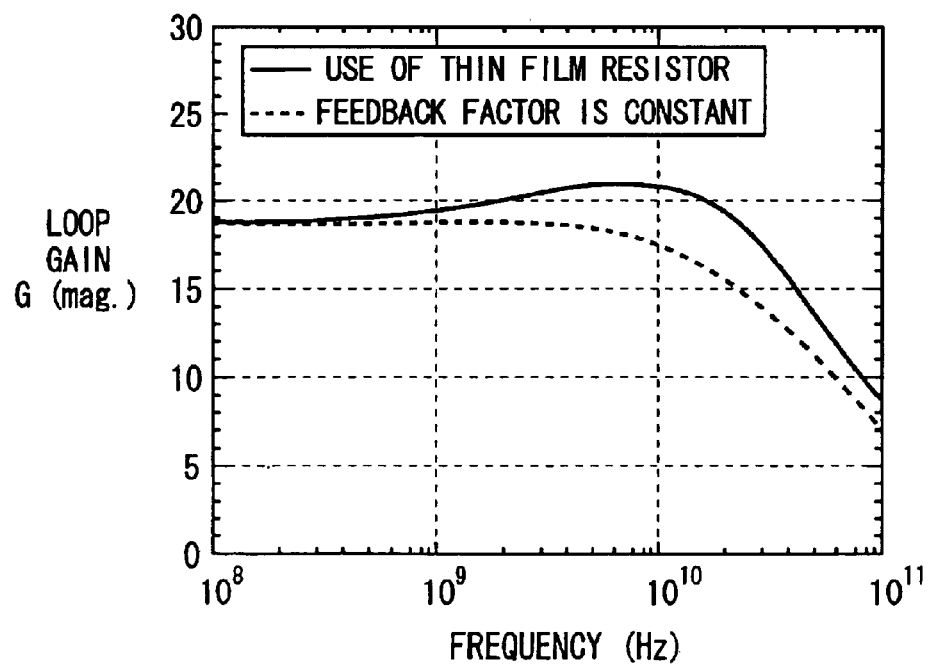
FIG. 11 is a diagram showing the frequency dependency of loop gain in the negative feedback amplifier shown in FIG. 8 using a feedback position having frequency dependency shown in FIG. 10 and a negative feedback amplifier using a feedback portion having a constant feedback factor.

FIG. 11 is a diagram showing the frequency dependency of loop gain G in the negative feedback amplifier shown in FIG. 8 using the feedback portion 102 having frequency dependency shown in FIG. 10 and a negative feedback amplifier using a feedback portion having a constant feedback factor. Open-loop gain is A=100 (a cut-off frequency $f_C$=10 [GHz]). A solid line indicates a case where the feedback portion 102 having the frequency dependency shown in FIG. 10 is used (the thin film resistor is used), and a broken line indicates a case where the feedback factor is constant.

As can be seen from FIG. 11, when the feedback portion 102 having the frequency dependency shown in FIG. 10 is used, the frequency characteristics are improved in a high frequency region of not less than 5 GHz, as compared with that in a case where a feedback portion having a constant feedback factor is used.

(6) Specific Example of Negative Feedback Amplifier

A specific example of the negative feedback amplifier according to the present embodiment will be described.

Figure 12:
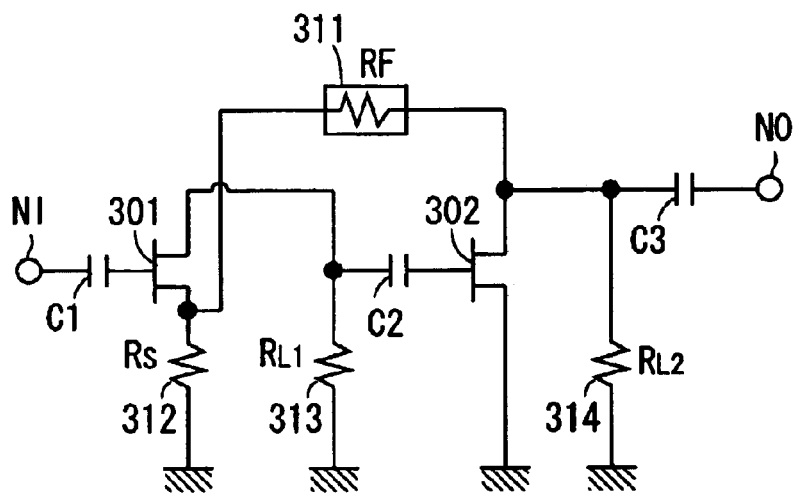
FIG. 12 is a circuit diagram showing a voltage-series feedback amplifier in the present embodiment.

FIG. 12 is a circuit diagram showing a voltage-series feedback amplifier in the present embodiment.

The voltage-series feedback amplifier shown in FIG. 12 comprises an FET (a field effect transistor) 301 in the front stage, an FET 302 in the back stage, a feedback resistor 311, a source resistor 312, drain resistors 313 and 314, capacitors C1 and C3, and an interstage capacitor C2.

The FET 301 has its gate connected to an input terminal NI through the capacitor C1, has its drain grounded through the drain resistor 313, and has its source grounded through the source resistor 312. The interstage capacitor C2 is connected between the drain of the FET 301 and the gate of the FET 302. The FET 302 has its source grounded, and has its drain connected to the source of the FET 301 through the feedback resistor 311 and grounded through the drain resistor 314. The capacitor C3 is connected between the drain of the FET 302 and an output terminal NO. In FIG. 12, the illustration of a bias circuit is omitted.

The feedback resistor 311 and the source resistor 312 constitute a feedback portion. The feedback resistor 311 is formed of a thin film resistor having frequency dependency, and the source resistor 312 is formed of a semiconductor resistor capable of almost ignoring frequency dependency. The feedback factor β of the feedback portion is expressed by the following equation:

$$\beta = -R_S/(R_S+R_F) \qquad (20)$$

where $R_S$ is the resistance value of the source resistor 312, and $R_F$ is the resistance value of the feedback resistor 311.

Open-loop gain A in the amplifier shown in FIG. 12 is expressed by the following equation:

$$A = g_m^2 R_{L1} R_{L2}/(1+g_m R_S) \qquad (21)$$

where $g_m$ is a mutual conductance, $R_{L1}$ is the resistance value of the drain resistor 313, and $R_{L2}$ is the resistance value of the drain resistor 314.

It is preferable that the resistance value $R_F$ of the feedback resistor 311 is set to tens of ohms to hundreds of ohms, and the resistance value $R_S$ of the source resistor 312 is set to several ohms to tens of ohms.

In the voltage-series feedback amplifier shown in FIG. 12, a thin film resistor is used as the feedback resistor 313 in the feedback portion, thereby improving frequency characteristics in a high frequency region.

Figure 13:
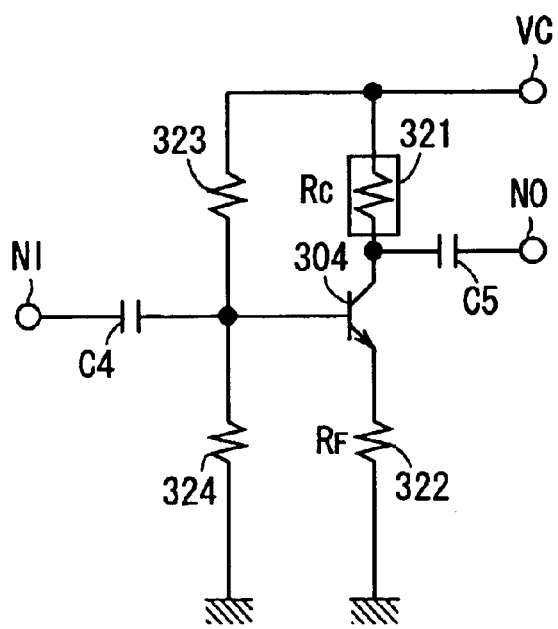
FIG. 13 is a circuit diagram showing a current-series feedback amplifier in the present invention.

FIG. 13 is a circuit diagram showing a current-series feedback amplifier in the present embodiment.

The current-series feedback amplifier shown in FIG. 13 comprises a bipolar transistor 304, a collector resistor 321, a feedback resistor 322, resistors 323 and 324, and capacitors C4 and C5.

The transistor 304 has its base connected to an input terminal NI through the capacitor C4, and has its collector connected to a power supply terminal VC through the collector resistor 321. In this case, the collector of the transistor 304 is grounded in a high frequency manner. The transistor 304 has its emitter grounded through the feedback resistor 322. The transistor 304 has its base connected to the power supply terminal VC through the resistor 323 and grounded through the resistor 324. The capacitor C5 is connected between the collector of the transistor 304 and an output terminal NO.

The collector resistor 321 and the feedback resistor 322 constitute a feedback portion. The collector resistor 321 is formed of a thin film resistor having frequency dependency, and the feedback resistor 322 is formed of a semiconductor resistor capable of almost ignoring frequency dependency. The feedback factor β of the feedback portion is expressed by the following equation:

$$\beta = -(1+h_{fe})R_F/h_{fe}R_C \approx -R_F/R_C \tag{22}$$

where $h_{fe}$ is emitter grounded current gain, $R_C$ is the resistance value of the collector resistor 321, and $R_F$ is the resistance value of the feedback resistor 322.

Open-loop gain A in the amplifier shown in FIG. 13 is expressed by the following equation:

$$A = h_{fe}/\{r_b + (1+h_{fe}) \cdot r_e\} \tag{23}$$

where $r_b$ is a base internal resistance in the transistor 304, $r_e$ is an emitter internal resistance in the transistor 304.

It is preferable that the resistance value $R_C$ of the collector resistor 321 is set to hundreds of ohms to several kilo-ohms, and the resistance value $R_F$ of the feedback resistor 322 is set to several ohms to hundreds of ohms.

In the current-series feedback amplifier shown in FIG. 13, a thin film resistor is used as the collector resistor 321 in the feedback portion, thereby improving frequency characteristics in a high frequency region.

Figure 14:
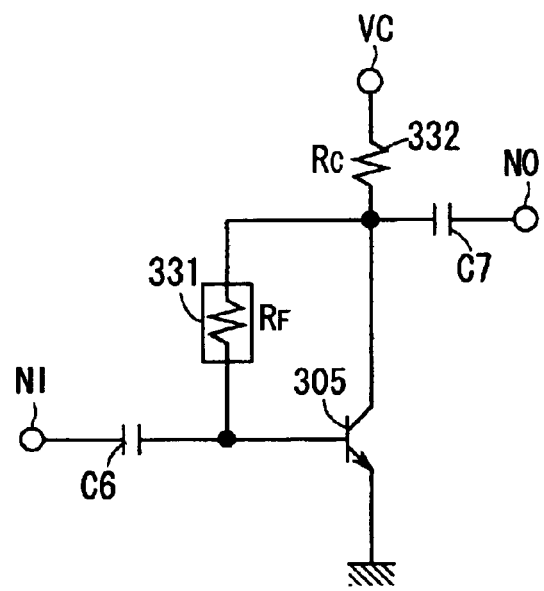
FIG. 14 is a circuit diagram showing a voltage-parallel feedback amplifier in the present embodiment.

FIG. 14 is a circuit diagram showing a voltage-parallel feedback amplifier in the present embodiment.

The voltage-parallel feedback amplifier shown in FIG. 14 comprises a bipolar transistor 305, a feedback resistor 331, a collector resistor 332, and capacitors C6 and C7.

The transistor 305 has its base connected to an input terminal NI through the capacitor C6, and has its collector connected to a power supply terminal VC through the collector resistor 332. In this case, the collector of the transistor 305 is grounded in a high frequency manner. The transistor 305 has its emitter grounded. The feedback resistor 331 is connected between the collector and the base of the transistor 305. The capacitor C7 is connected between the collector of the transistor 305 and an output terminal NO.

The feedback resistor 331 and the collector resistor 332 constitute a feedback portion. The feedback resistor 331 is formed of a thin film resistor having frequency dependency, and the collector resistor 332 is formed of a semiconductor resistor capable of almost ignoring frequency dependency. The feedback factor β of the feedback portion is expressed by the following equation:

$$\beta = -R_C/R_F \tag{24}$$

where $R_F$ is the resistance value of the feedback resistor 331, and $R_C$ is the resistance value of the collector resistor 332.

Open-loop gain A in the amplifier shown in FIG. 14 is expressed by the following equation:

$$A = h_{fe}/\{1+(1+h_{fe}) \cdot R_C/R_F\} \tag{25}$$

where $h_{fe}$ is emitter grounded current gain. In this case, it is preferable that the resistance value $R_F$ of the feedback resistor 311 is set to hundreds of ohms to tens of kilo-ohms, and the resistance value $R_C$ of the collector resistor 322 is set to tens of ohms to several kilo-ohms.

In the voltage-series feedback amplifier shown in FIG. 14, a thin film resistor is used as the feedback resistor 331 in the feedback portion, thereby improving frequency characteristics in a high frequency region.

Figure 15:
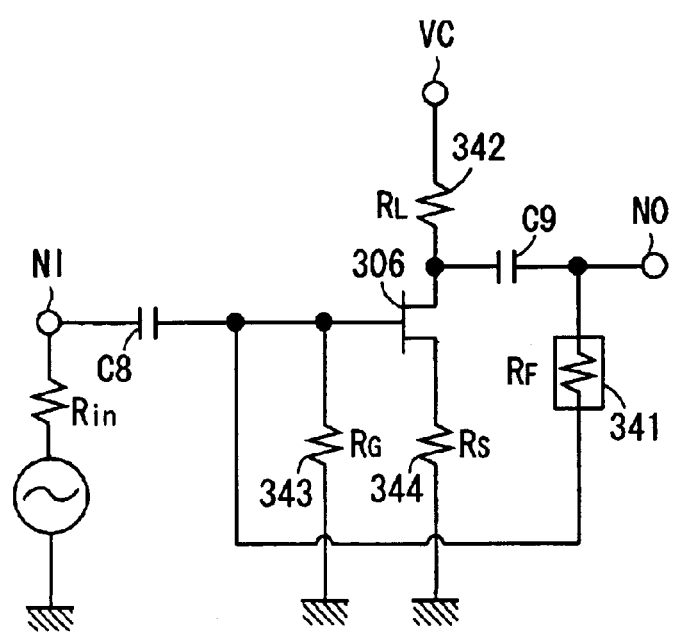
FIG. 15 is a circuit diagram showing a current-parallel feedback amplifier in the present embodiment.

FIG. 15 is a circuit diagram showing a current-parallel feedback amplifier in the present embodiment.

The current-parallel feedback amplifier shown in FIG. 15 comprises a FET 306, a feedback resistor 341, a drain resistor 342, a gate resistor 343, a source resistor 344, and capacitors C8 and C9.

The FET 306 has its gate connected to an input terminal NI through the capacitor C8 and grounded through the gate resistor 343. The FET 306 has its drain connected to a power supply terminal VC through the drain resistor 342. In this case, the drain of the FET 306 is grounded in a high frequency manner. The FET 306 has its source grounded through the source resistor 344. The capacitor C9 is connected between the drain of the FET 306 and an output terminal NO. Further, the feedback resistor 341 is connected between the output terminal NO and the gate of the FET 306.

The feedback resistor 341 and a signal source impedance $R_{in}$ constitute a feedback portion. The feedback resistor 341 is formed of a thin film resistor having frequency dependency, and the feedback factor β of the feedback portion is expressed by the following equation:

$$\beta = R_{in}/R_F \tag{26}$$

where $R_F$ is the resistance value of the feedback resistor 341, and $R_{in}$ is the signal source impedance.

Open-loop gain A in the amplifier shown in FIG. 15 is expressed by the following equation:

$$A = g_m R_L/(r_d + R_L) \tag{27}$$

where $g_m$ is a mutual conductance, $R_L$ is the resistance value of the drain resistor 342, and $r_d$ is a drain internal resistance. In this case, when the signal source impedance $R_{in}$ is taken as 50Ω, it is preferable that the resistance value $R_F$ of the feedback resistor 341 is set to hundreds of ohms to several kilo-ohms.

In the current-series feedback amplifier shown in FIG. 15, a thin film resistor is used as the feedback resistor 341 in the feedback portion, thereby improving frequency characteristics in a high frequency region.

Figure 16:
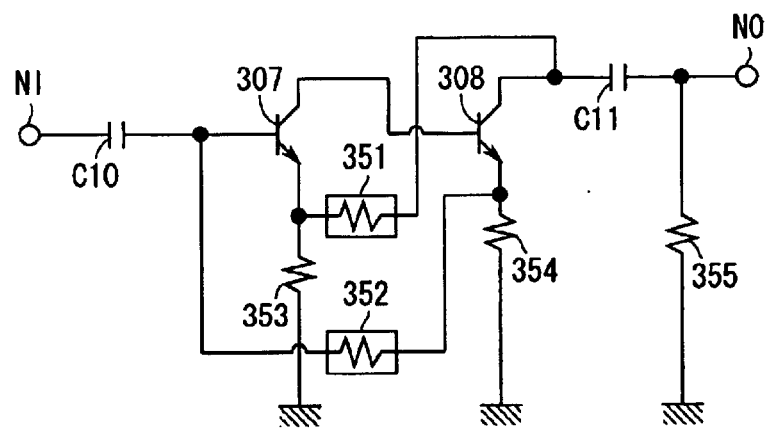
FIG. 16 is a circuit diagram showing a composite feedback amplifier in the present embodiment.

FIG. 16 is a circuit diagram showing a composite feedback amplifier in the present embodiment. The composite feedback amplifier shown in FIG. 16 is a combination of the voltage-series feedback amplifier and the current-parallel feedback amplifier.

The composite feedback amplifier shown in FIG. 16 comprises a bipolar transistor 307 in the front stage, a bipolar transistor 308 in the back stage, feedback resistors 351 and 352, emitter resistors 353 and 354, an output resistor 355, and capacitors C10 and C11.

The transistor 307 in the front stage has its base connected to an input terminal NI through the capacitor C10, has its collector connected to the base of the transistor 308 in the back stage, and has its emitter grounded through the emitter resistor 353. The transistor 308 in the back stage has its collector connected to the emitter of the transistor 307 in the front stage through the feedback resistor 351. The transistor 308 in the back stage has its emitter grounded through the emitter resistor 354 and connected to the base of the transistor 307 in the front stage through the feedback resistor 352. The capacitor C11 is connected between the collector of the transistor 308 and an output terminal NO, and the output terminal NO is grounded through the output resistor 355. In FIG. 16, the illustration of a bias circuit is omitted.

The feedback resistor 351 and the emitter resistor 353 constitute a first feedback portion, and the feedback resistor 352 and a signal power impedance constitute a second feedback portion. The feedback resistors 351 and 352 are formed of a thin film resistor having frequency dependency, and the emitter resistor 353 is formed of a semiconductor resistor capable of almost ignoring frequency dependency.

In the composite feedback amplifier shown in FIG. 16, thin film resistors are respectively used as the feedback resistors 351 and 352, thereby improving frequency characteristics in a high frequency region.

Figure 17:
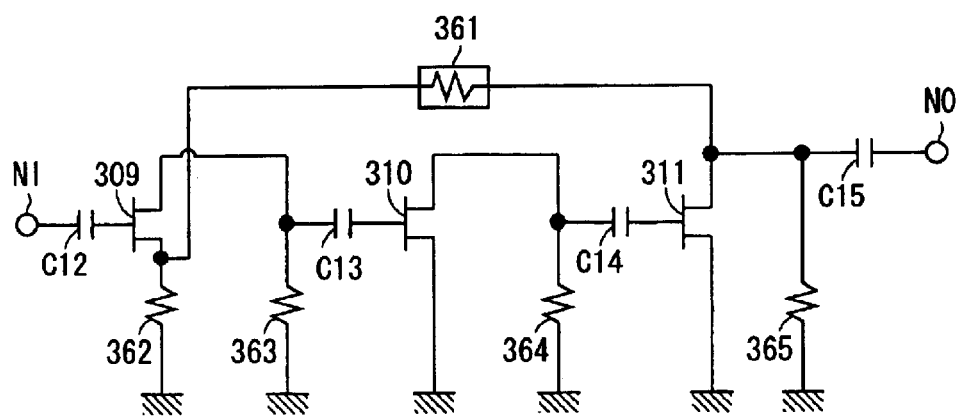
FIG. 17 is a circuit diagram showing a voltage-series feedback amplifier in the present embodiment.
Figure 18:
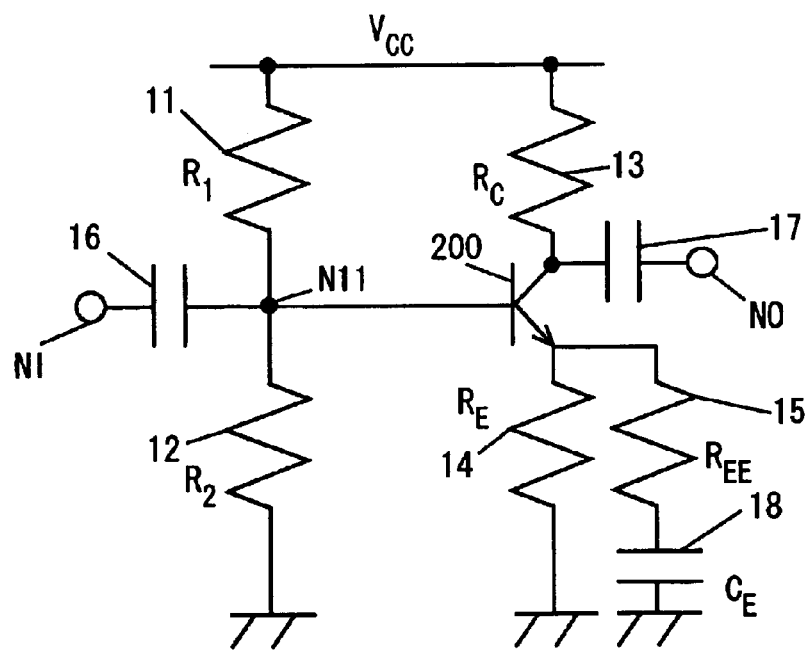
FIG. 18 is a circuit diagram showing the configuration of a conventional emitter grounded wide-band amplifier.
Figure 19:
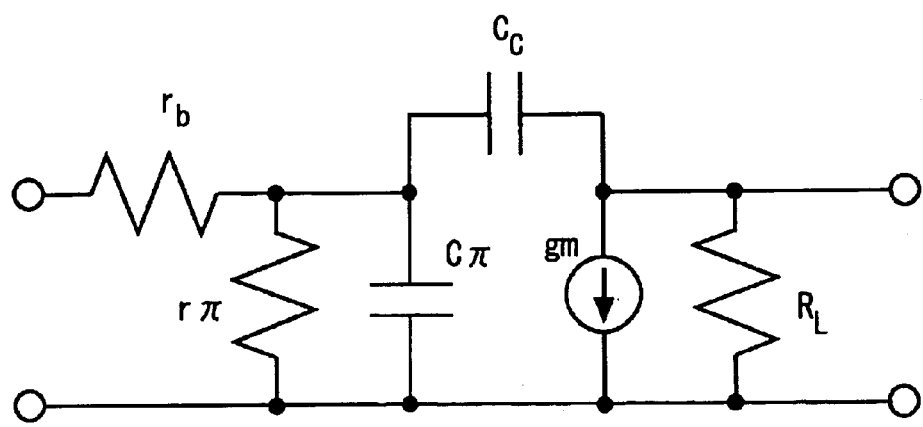
FIG. 19 is an equivalent circuit diagram of the amplifier shown in FIG. 18 in a case where a transistor is represented by a hybrid π-type equivalent circuit.
Figure 20:
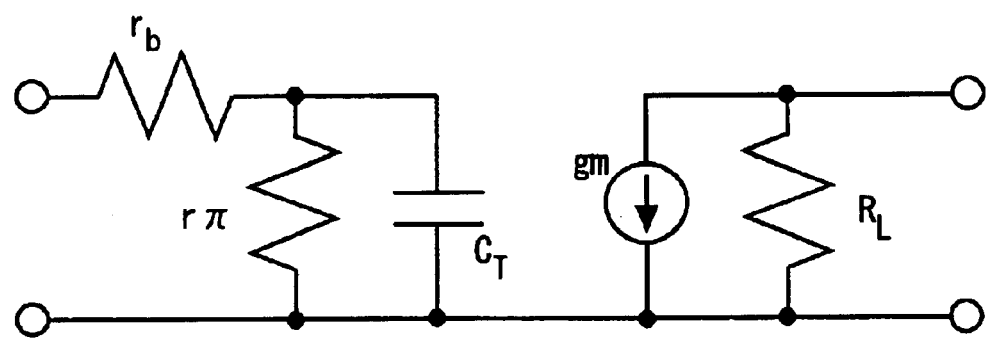
FIG. 20 is an equivalent circuit diagram in a case where consideration is given to the mirror effect of the amplifier shown in FIG. 18.

FIG. 17 is a circuit diagram showing a voltage-series feedback amplifier in the present embodiment.

The voltage-series feedback amplifier shown in FIG. 17 comprises FETs 309, 310, and 311 in three stages, a feedback resistor 361, a source resistor 362, drain resistors 363, 364, and 365, capacitors C12 and C15, and interstage capacitors C13 and C14.

The FET 309 has its gate 7 connected to an input terminal NI through the capacitor C12, has its source grounded through the source resistor 362, and has its drain grounded through the drain resistor 363. The FET 310 has its gate connected to the drain of the FET 309 through the interstage capacitor C13, has its source grounded, and has its drain grounded through the drain resistor 364. The FET 311 has its gate connected to the drain of the FET 310 through the interstage capacitor C14, has its source grounded, and has its drain connected to the source of the FET 309 through the feedback resistor 361 and grounded through the drain resistor 365. The capacitor C15 is connected between the drain of the FET 311 and an output terminal NO. In FIG. 17, the illustration of a bias circuit is omitted.

The feedback resistor 361 and the source resistor 362 constitute a first feedback portion. The feedback resistor 361 is formed of a thin film resistor having frequency dependency, and the source resistor 362 is formed of a semiconductor resistor capable of almost ignoring frequency dependency.

In the voltage-series feedback amplifier shown in FIG. 17, frequency characteristics in a high frequency region are improved by using a thin film resistor as the feedback resistor 361.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high frequency circuit comprising:
    a transistor having a first terminal receiving an input signal and having a second terminal and a third terminal;
    a first circuit connected to said second terminal of said transistor; and
    a second circuit connected to said third terminal of said transistor,
    at least one of said first and second circuits comprising one or a plurality of thin film resistors,
    wherein said one or plurality of thin film resistors have a thickness smaller than three times its skin depth at a predetermined frequency in the range of 1 GHz to 10 GHz, and
    wherein a resistance value of said one or plurality of thin film resistors varies with respect to a frequency in the range of 1 GHz to 10 GHz by a skin effect.

2. The high frequency circuit according to claim 1, wherein
    said first circuit is connected between said second terminal of said transistor and a power supply terminal receiving a power supply voltage, and
    said second circuit is connected between said third terminal of said transistor and a grounding terminal receiving a grounding potential.

3. The high frequency circuit according to claim 2, wherein
    at least one of said first and second circuits comprises a series connection of said one or a plurality of thin film resistors and one or a plurality of resistors having no frequency dependency.

4. The high frequency circuit according to claim 2, wherein
    at least one of said first and second circuits comprises a parallel connection of one or a plurality of thin film resistors and said one or a plurality of resistors having no frequency dependency.

5. The high frequency circuit according to claim 1, wherein
    said first circuit has a feedback circuit for feeding back a signal at said second terminal of said transistor to said first terminal, and
    said feedback circuit comprises said one or plurality of thin film resistors.

6. The high frequency circuit according to claim 5, further comprising
    one or a plurality of other transistors,
    said feedback circuit feeding back a signal at said second terminal to said first terminal through said one or plurality of other transistors.

7. The high frequency circuit according to claim 5, wherein
    said feedback circuit has a feedback path for applying a part of voltage signal at said second terminal to said first terminal in series, and
    said feedback path comprises said one or plurality of thin film resistors and one or plurality of resistors having no frequency dependency.

8. The high frequency circuit according to claim 5, wherein
    said feedback circuit has a feedback path comprising a conversion portion for converting a part of a current signal at said second terminal into a voltage signal and application portion for applying the voltage signal obtained by said conversion portion to said first terminal in series,
    said feedback path comprising said one or plurality of thin film resistors and one or plurality of resistors having no frequency dependency.

9. The high frequency circuit according to claim 5, wherein
    said feedback circuit has a feedback path comprising a conversion portion for converting a voltage signal at said second terminal into a current signal and an plication portion for applying the current signal obtained by said conversion portion to said first terminal in parallel,
    said feedback path comprising said one or plurality of thin film resistors and one or plurality of resistors having no frequency dependency.

10. The high frequency circuit according to claim 5, wherein
   said feedback circuit has a feedback path for applying a part of a current signal at said second terminal to said first terminal in parallel, and
   said feedback path comprises said one or plurality of thin film resistors and one or plurality of resistors having no frequency dependency.

11. The high frequency circuit according to claim 5, wherein
   said feedback circuit has a first feedback path for applying a part of a voltage signal at said second terminal to said first terminal in series and a second feedback path for applying a part of a current signal at said second terminal to said first terminal in parallel, and
   each of said first feedback path and said second feedback path comprises said one or plurality of thin film resistors and one or plurality of resistors having no frequency dependency.

12. The high frequency circuit according to claim 1, wherein said one or plurality of thin film resistors have a thickness of n t more than the skin depth at said predetermined frequency.

13. The high frequency circuit according to claim 1, wherein said transistor is a bipolar transistor.

14. The high frequency circuit according to claim 1, wherein
   said transistor is a field effect transistor.

15. The high frequency circuit according to claim 1, wherein
   said one or plurality of thin film resistors are formed of a thin film of a metal or a metal compound.

16. The high frequency circuit according to claim 15, wherein
   said thin film of the metal or the metal compound includes aluminum, titanium, or tantalum.

17. The high frequency circuit according to claim 3, wherein
   said one or plurality of resistors having no frequency dependency are composed of a semiconductor.

18. The high frequency circuit according to claim 4, wherein
   said one or plurality of resistors having no frequency dependency are composed of a semiconductor.

* * * * *